April 10, 1962 J. W. ENGLUND 3,029,340

TRANSISTOR DETECTOR-AUDIO AMPLIFIER

Filed March 23, 1959 2 Sheets-Sheet 1

INVENTOR.
JOHN W. ENGLUND
BY
A. Russinoff
ATTORNEY

April 10, 1962 J. W. ENGLUND 3,029,340

TRANSISTOR DETECTOR-AUDIO AMPLIFIER

Filed March 23, 1959 2 Sheets-Sheet 2

INVENTOR.
JOHN W. ENGLUND
BY A. Russinoff
ATTORNEY

United States Patent Office 3,029,340
Patented Apr. 10, 1962

3,029,340
TRANSISTOR DETECTOR-AUDIO AMPLIFIER

John W. Englund, Somerville, N.J., assignor to Radio Corporation of America, a corporation of Delaware
Filed Mar. 23, 1959, Ser. No. 801,008
8 Claims. (Cl. 250—20)

This invention relates generally to signal processing means for radio receivers, and more particularly to semiconductor devices and circuits for detecting and amplifying the amplitude modulating signals of received high frequency carrier waves.

In transistor receivers, it is the usual practice to apply amplitude modulated carrier wave or intermediate frequency wave energy to a detecting circuit including a rectifier, to derive the transmitted modulating signal information. The rectifier used in the detecting circuit ordinarily comprises either a separate semiconductor rectifier device or, at a sacrifice in audio frequency signal gain, the base-emitter path of a transistor audio frequency amplifier stage. The derived signal information is then amplified by a transistor amplifier circuit before being applied to utilization means which may, if desired, include additional amplifying stages.

The detecting circuit of many receivers also includes a network for deriving an automatic gain control (AGC) voltage, which is used to maintain the signal level at the detecting circuit input terminals substantially constant with changes in the intensity of a received carrier wave. The effectiveness of the AGC circuits in transistor receivers is an important factor in avoiding distortion or loss of sensitivity with the reception of strong signals which might otherwise cause over-loading or distortion due to the shifting of the bias on the amplifying devices to cause nonlinear amplification. To increase the effectiveness of the AGC circuits in a given receiver, the sensitivity is usually sacrificed because of the additional signal power required to drive the AGC circuits. This loss of sensitivity can be overcome by the provision of more amplification in the signal channel, or D.C. amplification of the AGC signal, either of which results in a more expensive receiver.

It is an object of this invention to provide an improved signal detector-audio amplifier stage for transistor receivers.

Another object of this invention is to provide an improved transistor device and circuit therefor for detecting and amplifying the signal components of a carrier wave applied thereto which is of simple construction and provides highly efficient operation.

Still another object of this invention is to provide an improved automatic gain control voltage deriving circuit for transistor receivers which provides highly effective control of the receiver gain over a wide range of received carrier signal levels.

In accordance with the invention, a combined rectifier-transistor device is provided which comprises a rectifying contact alloyed on to the base pellet of a junction transistor such that the low resistance direction of conductivity through the rectifying contact with respect to the base is the same as that of the emitter electrode of the transistor. The rectifying contact and the inherent input resistance of the transistor form a portion of a detecting circuit for deriving signal information from a signal modulated high frequency wave, such as an I.F. wave, applied between the rectifying contact and the emitter electrode. By virtue of the direct connection of the rectifying contact to the transistor pellet, the current flowing through the contact is amplified by the transistor and may be used to derive an amplified AGC voltage. The alloying of an additional rectifying contact on the base material of a transistor adds little to the total cost of the device, yet permits the construction of a combined detector-audio amplifier requiring a minimum number of component parts while providing the advantages of amplified AGC.

The novel features that are considered characteristic of this invention are set forth with particularity in the appended claims. The invention itself, however, both as to its organization and method of operation, as well as additional objects and advantages thereof, will best be understood from the following description when read in connection with the accompanying drawing, in which:

Figure 1:
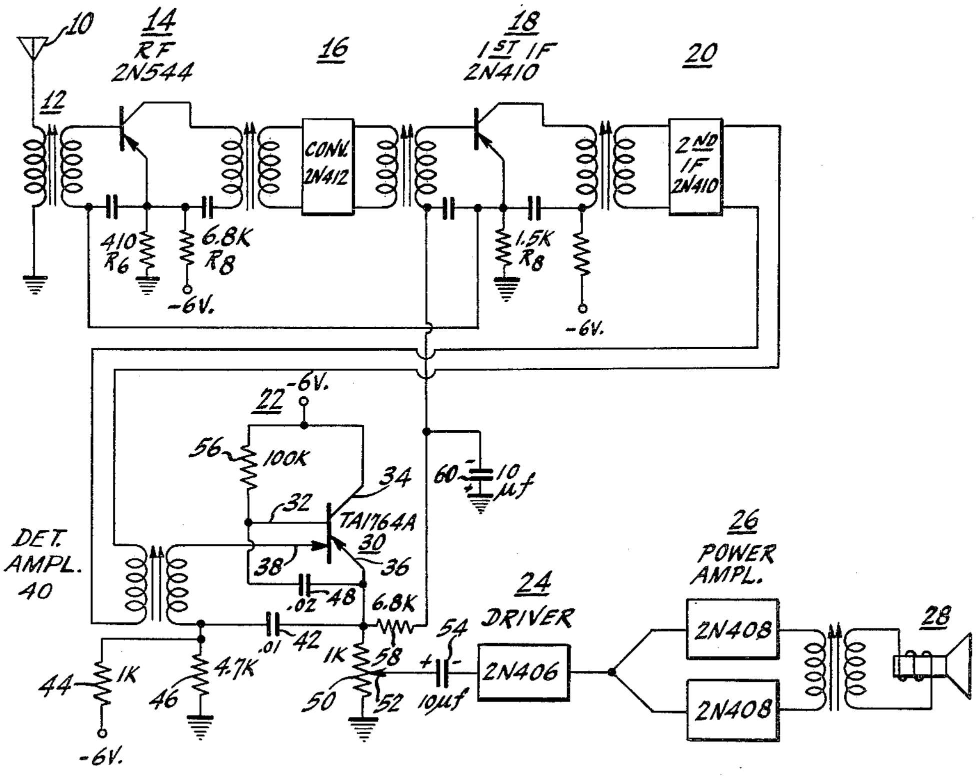
FIGURE 1 is a schematic circuit diagram of a transistor receiver including detector-audio amplifier circuits embodying the invention.

The transistor receiver shown schematically in FIGURE 1 includes an antenna 10 which is coupled through an antenna input transformer 12 to a radio frequency (RF) amplifier stage 14. Signals amplified by the RF amplifier stage 14 are applied to a converter stage 16, which may, if desired, comprise separate mixer and oscillator stages, where they are heterodyned with a local oscillator signal to produce a corresponding signal of intermediate frequency. The resulting intermediate frequency (IF) signal is then amplified by the IF amplifier stages 18 and 20 before being applied to detector-audio amplifier stage 22.

The detector portion of the stage 22 serves to derive the modulating signal from the IF wave applied thereto, while the amplifier stage portion of the stage 22 amplifies the detected modulating signal before it is applied to the driver audio frequency amplifier stage 24. As shown in FIGURE 1, the signal from the driver stage 24 is then fed to a power amplifier 26 before application to a loudspeaker 28.

The detector-audio amplifier stage 22 includes a combined rectifier-transistor device 30. The transistor portion of the device includes a base electrode 32, a collector electrode 34 and an emitter electrode 36, and the rectifier portion includes a rectifying junction 38 which has a direction of low resistance conductivity with respect to the base which is the same as that of the emitter electrode 36. Although the rectifier and transistor portions of the device 30 have been shown as PN and PNP types, respectively, the opposite conductivity types, i.e., an NP rectifier and NPN transistor, could also be used with suitable changes of bias voltage polarity.

Intermediate frequency signals from the second IF amplifier 20 are developed across a secondary winding 40 the end terminals of which are connected, respectively, with the rectifying junction 38 and through a capacitor 42 to the emitter electrode 36. A suitable fixed bias voltage is applied to the rectifier anode (junction 38) by a voltage divider including a pair of resistors 44 and 46 which are connected between ground and the negative terminal of a direct current source.

Intermediate frequency signals applied between rectifying junction 38 and the emitter 36 are rectified, and the modulating signal components flow through the effective input resistance of the transistor portion of the device 30 appearing between the base 32 and emitter 36. The high frequency (or IF) signal components are bypassed from the base 32 to the emitter 36 by a capacitor 48 the impedance of which at intermediate frequencies is low relative to the transistor input resistance. Thus, the capacitor 48 substantially eliminates fluctuations at the intermediate frequency rate between the input electrodes of the transistor portion of the device 30.

The D.C. path for the rectifier is completed through a resistor 50 connected between the emitter 36 and ground. A transistor bias resistor 56 which is connected from the base 32 to the negative terminal of a biasing current source is effectively in parallel with the rectifier D.C. load comprising the transistor input resistance and the resistor 50. However, the resistance of resistor 56 is high relative to that of the series combination of transistor input resistance and the resistor 50 and has little effect on the detector loading. The resistor 56 in combination with the resistors 44, 46 and 50 establish the quiescent operating bias on both the transistor and rectifier portions of the device 30. A slight forward bias is desirable on the rectifier portion of the device 30 to help reduce low level distortion and improve detection efficiency. Operating current for the transistor is provided by a direct connection from the collector 34 to the negative terminal of the supply source, and audio frequency signals amplified by the transistor circuit are derived from a movable volume controlling tap 52 on the resistor 50 and are coupled through a large value capacitor 54, such as an electrolytic capacitor, to the driver audio frequency amplifier 24.

Since the rectifying contact 38 is directly connected with the transistor base, the rectified signal current flowing through the transistor input resistance is amplified by the transistor 30 so that an amplified AGC voltage may be derived across the resistor 50. To this end a resistance capacitance filter network including a series resistor 58 and a shunt capacitor 60 are connected to the emitter 36 to derive a direct voltage, the amplitude of which varies with that of the received carrier level. This voltage is then applied to the base electrode of the first IF amplifier 18 to control the gain thereof as an inverse function of the received carrier strength.

It will be noted that as the received carrier level increases, the increased rectified signal current flowing in the input resistance of the transistor portion of the device 30 produces a reverse bias that causes a reduced emitter-collector current flow 36. This causes a less negative (more positive) voltage to appear at the emitter 36 and a correspondingly less negative AGC voltage is applied to the intermediate frequency amplifier 18. Since the amplifier 18 includes a transistor of the PNP conductivity type the less negative voltage tends to reduce the emitter current flow thereof causing a substantial reduction in IF gain for the stage. In addition, the changing AGC voltage is further amplified by the grounded emitter gain of the IF stage. This results in a still further amplified control voltage available at the emitter of the IF stage 18 for controlling the RF amplifier 14 gain as an inverse function of carrier level. It should be noted that the AGC action for both stages is effected without shunting or loading the detector circuit.

Figure 2:
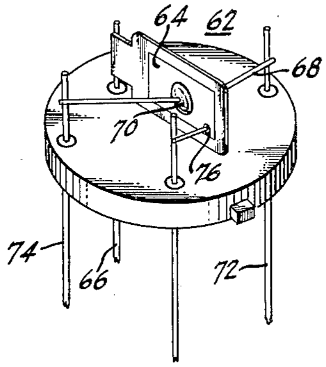
FIGURE 2 is a perspective view, greatly enlarged, of a transistor-rectifier device of a type which may be used in the detector-audio amplifier circuits of the receiver shown in FIGURE 1.

FIGURE 2 illustrates a combined rectifier-transistor device of the type which may be used in the detector-audio amplifier circuit of FIGURE 1. The device 62, which is normally encapsulated, includes a base pellet 64 which is conductively connected to an externally accessible connecting lead 66. An emitter electrode 68 and a collector electrode 70 are alloyed to opposite sides of the pellet, and are connected to externally accessible connecting leads 72 and 74, respectively. A rectifying contact 76 is alloyed to the collector side of the base pellet. In the position shown, the contact 76 is at a distance greater than one diffusion length from the emitter and approximately one diffusion length from the collector thus minimizing interaction between the rectifier and transistor portions of the device. The resulting structure comprises an alloyed PN junction diode alloyed PNP junction transistor combination on a single N type base region, such as N type germanium, common to both portions of the device. Alternatively, the structure may comprise an NP junction on an NPN transistor, with a common P type base region.

The transistor portion of the device has been designed as a low power class A audio frequency amplifier. This application requires close control over certain parameters to give the desired operating performance. In order to give uniform amplification over the frequency range to be covered, the frequency cutoff in the grounded-base configuration is designed to be 1 mc., requiring a spacing between the emitter and collector junctions of 1.6 mils. A resistivity range of 2–4 ohm-cm. was chosen to give the low saturation current and high breakdown voltage required. This resistivity range will give $r_{bb'}$ (intrinsic base lead resistances) values of 100 ohms or below.

The use of a gallium-silver-indium alloy as the emitter dot material results in high hole injection efficiency so that for the spacing used, D.C. current gains (beta) of 70 are easily obtained. When this material is utilized a flat fall-off characteristic results, ensuring uniform current gain over the desired range of collector current.

The high average beta obtained results in a moderately high input impedance of approximately 2000ω in the grounded-emitter circuit configuration. This represents a better rectifier loading than most detector circuits at sensitivity level, making the use of the device advantageous from the standpoint of detector efficiency and distortion.

The alloyed junction rectifier offers many advantages over a point contact diode when used as a detector. Particularly, the forward characteristic is improved, owing to the higher injection efficiency obtained with an alloyed junction resulting in a low forward resistance. There is also a marked improvement in the reverse characteristic. The two factors result in considerably higher detection efficiency for the alloyed junction rectifier.

Figure 3:
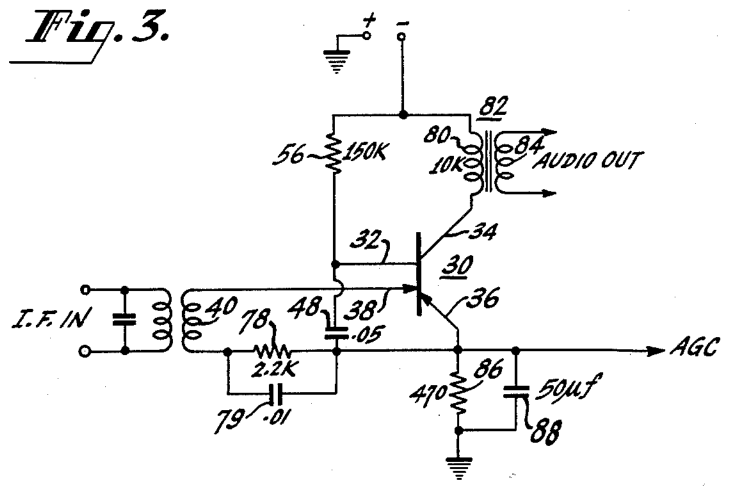
FIGURES 3 and 4 are schematic circuit diagrams illustrating modifications of the detector-audio amplifier circuits shown in FIGURE 1.

The schematic circuit diagram of FIGURE 3 shows a modification of the detector-audio amplifier circuit shown in FIGURE 1, and like reference numerals are used to designate similar elements. Incoming signal modulated intermediate frequency waves developed across the secondary winding 40 of the intermediate frequency transformer are coupled to the rectifying contact 38, and to the emitter electrode 36 through a resistance-capacitance network comprising a resistor 78 and a capacitor 79. Rectified modulation signal currents flow through the input resistance of the transistor portion of the device 30, i.e., the effective resistance appearing between the base electrode 32 and emitter junction 36. As in the embodiment shown in FIGURE 1 the high frequency or intermediate frequency components are bypassed across the input resistance through the capacitor 48.

Audio frequency signals developed across the input resistance of the transistor portion of the device 30 are amplified and developed across a primary winding 80 of an audio frequency transformer 82. These signals are magnetically coupled to a secondary winding 84, and are applied therefrom to utilization means such as a loudspeaker or further amplifier stages. An emitter resistor 86 which is bypassed by a large value capacitor 88 is connected between the emitter electrode 36 and the point of reference potential, such as ground. Operating current for the transistor is provided by the negative terminal of a current source which is connected to the collector electrode 34 through the primary winding 80. The negative terminal of the current source is also connected through a base bias resistor 56 to the base electrode 32.

The resistors 56, 78 and 86 determine the quiescent bias of rectifying junction 38 and on the transistors portion of the device 30. As mentioned above, it is desirable to provide a slight forward bias on the rectifying junction 38 to reduce low signal level distortion and improve the detector efficiency. Regarding the transistor base bias, it should be noted that as the amplitude of the modulated IF signal is increased, the detector rectifier conducts more, and a positive going voltage is developed at the base of the transistor section. The unidirectional rectifier current is amplified by the current gain of the transistor and results in an amplified gain control voltage at the emitter 36 as shown in the drawing. It should be noted that a positive going voltage at the base of the transistor is accompanied by a decrease in collector current. On strong received signals, if it were not for AGC being applied to previous stages, the positive voltage at the base would be sufficient to alter the bias of the transistor amplifier to a non-linear region of its transconductance curve with resultant distortion. For this reason, in the design of the AGC network, considerations must be given to the change of bias of the class A operated transistor section with received signal. A proper design criterion is to ensure sufficient AGC action to maintain the operating point of the audio amplifier in its most linear region.

As mentioned above in connection with FIGURE 1, the direct connection of the rectifying contact 38 with the base electrode 32 enables a current gain to be achieved between the emitter and collector junctions 36 and 34 respectively. This current causes the voltage to be produced across the emitter resistor 86 which is by-passed by the large capacitor 88 to produce an AGC voltage which may be used to control the gain of the preceding signal translating stages. Representative values for the circuit components used in FIGURES 1 and 3 are shown in the drawings.

Figure 4:
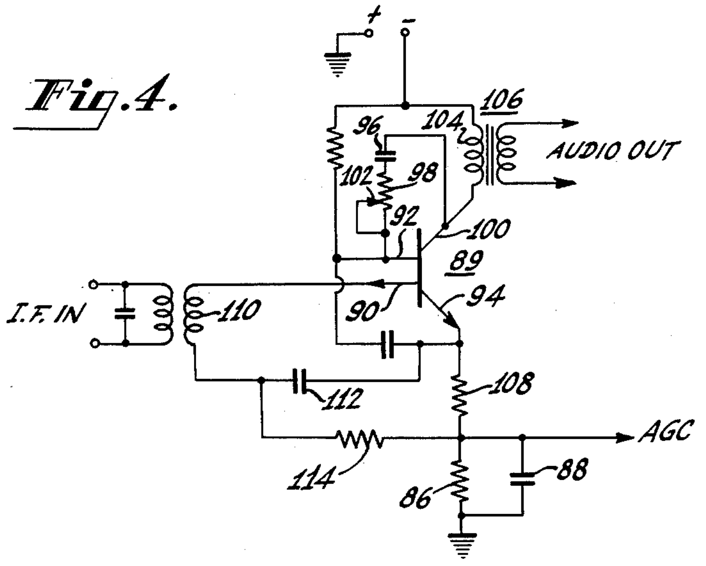

The embodiment of the invention shown in FIGURE 4 is similar to that shown in FIGURE 3 with three exceptions. The first is that the conductivity type of device 89 shown in FIGURE 4 is the opposite of that shown in FIGURE 3. However, it will be noted that the direction of forward conductivity of the rectifying contact 90 with respect to the base 92 is in the same direction as that of the emitter junction 94. The second distinguishing feature is that a volume control has been added to the circuit of FIGURE 4 which comprises a large value capacitor 96 and a high maximum value variable resistor 98 connected between the collector electrode 100 and the base 92. The capacitor 96 presents very low impedance to signals in the audio frequency range, and the variable resistor 96 controls the amount of feedback between the collector electrode 100 and the base 92. Maximum gain is effected when the movable tap 102 is closest to the base end of the resistor 98 since at this position minimum negative feedback occurs. As a tap 102 is moved closer to the collector end of the resistor 98 the amount of negative feedback is progressively increased thereby causing a corresponding decrease in the amount of signal developed across the primary winding 104 of the audio output transformer 106.

The third distinguishing feature of the circuit of FIGURE 4 over that of FIGURE 3 is that a small resistor 108 is connected in series between the emitter electrode 94 and the resistance capacitance network for developing the automatic gain control voltage. It should be noted that the intermediate frequency signals developed across the secondary winding 110 of the intermediate frequency input transformer are coupled between the rectifying contact 90 and through a capacitance 112 to the emitter 94. However, the direct current path for the rectifying contact 90 includes the input resistance of the device 89 which appears between the base 92 and emitter 94, the resistor 108 and the resistor 114. Since the resistor 108 is connected in common with the input and output circuits of the transistor amplifier portion of the circuit and is unbypassed for audio frequency signals, the resistor provides D.C. degeneration which raises the input impedance of the amplifier and lowers the D.C. gain so that the bias excursions on the transistor portion of the device 89 with variations in input signal level is reduced.

What is claimed is:

1. A second detector-audio amplifier for radio signal receivers comprising a rectifier-transistor device, the transistor portion of which includes a base, emitter and collector electrodes; a rectifying contact on said base electrode having a low resistance conductivity direction with respect to said base which is the same as that of said emitter-electrode; means connecting the base, emitter and collector electrodes of the transistor portion of said device to amplify signals applied between said base and emitter electrodes; and means providing a detector circuit for deriving a signal representative of the amplitude modulation of a high frequency wave applied thereto including said rectifying contact, the input resistance between said base and emitter electrodes, and a bypass impedance connected between said base and emitter electrodes to provide between said base and emitter electrodes a substantially lower impedance to signals of said high frequency than said input resistance, and a higher impedance to signals of the modulating frequency than said input resistance.

2. In a signal receiver of the type including a plurality of variable gain signal translating stages, an amplified automatic gain control deriving circuit comprising in combination a transistor device including emitter, collector and base electrodes and a rectifying junction associated with said base electrode, circuit means connecting said transistor device to amplify signals applied between the emitter and base electrodes thereof including impedance means connected between said collector and emitter electrodes, means for applying signal representative of a signal received and translated through said signal translating stages connected between said rectifying junction and said emitter electrode to produce a rectified current through the input resistance of said transistor device, filter means connected with said impedance means for deriving a gain control voltage the amplitude of which is a function of level of a received signal, and means for applying said gain control voltage to at least one of said signal translating stages to control the gain thereof as an inverse function of the strength of said received signal.

3. A second detector-audio amplifier for radio frequency receivers comprising a rectifier-transistor device having a base pellet including emitter and collector rectifying junctions alloyed thereto; a rectifying contact alloyed to said pellet having a low resistance conductivity direction with respect to said base which is the same as that of said emitter junction; input circuit means having a first terminal coupled to said rectifying contact and a second terminal coupled through a parallel resistor-capacitor network to said emitter junction for applying signal modulated high frequency waves therebetween; circuit means for deriving a signal representative of the modulation of said high frequency waves including said rectifying contact, the input resistance between said base pellet and emitter junction, and an impedance element which exhibits low impedance to said high frequency waves relative to said input resistance connected between said base pellet and said emitter junction; and means including an output circuit for connecting said base pellet, emitter and collector junctions for amplifying signal current flowing in said input resistance.

4. A second detector-audio amplifier for radio frequency receivers comprising a rectifier-transistor device having a base pellet including emitter and collector rectifying junctions alloyed thereto; a rectifying contact alloyed to said pellet having a low resistance conductivity direction with respect to said base which is the same as that of said emitter junction; input circuit means having a first terminal coupled to said rectifying contact and a second terminal coupled through a parallel resistor-capacitor network to said emitter junction for applying signal modulated high frequency waves between said rectifying contact and said emitter junction; circuit means for deriving a signal representative of the modulation of said high frequency waves including said rectifying contact, the input resistance between said base pellet and emitter junction, and an impedance element which exhibits low impedance to said high frequency waves relative to said input resistance connected between said base pellet and said emitter junction; means providing a source of bias voltage; output circuit means connected in series with said source between said emitter and collector junctions; and a resistor for establishing the quiescent bias level on said transistor-rectifier device connected between said base pellet and said source.

5. A second detector-audio amplifier for radio frequency receivers comprising a rectifier-transistor device having a base pellet including emitter and collector rectifying junctions alloyed thereto; a rectifying contact alloyed to said pellet having a low resistance conductivity direction with respect to said base which is the same as that of said emitter junction; input circuit means having a first terminal coupled to said rectifying contact and a second terminal coupled through a parallel resistor-capacitor network to said emitter junction for applying signal modulated high frequency waves between said rectifying contact and said emitter junction; circuit means for deriving a signal representative of the modulation of said high frequency waves including said rectifying contact, the input resistance between said base pellet and emitter junction, and an impedance element which exhibits low impedance to said high frequency waves relative to said input resistance connected between said base pellet and said emitter junction; means providing a source of bias voltage having a pair of terminals; signal output circuit means connected between said collector junction and one terminal of said source; a resistor and a large value capacitor connected in parallel between said emitter electrode and the other terminal of said source for developing thereacross an amplified AGC voltage, the amplitude of which varies as a function of the level of said high frequency waves, and a resistor for establishing the quiescent bias level on said transistor and said rectifier connected between said base pellet and said source.

6. In a signal receiver of the type including a plurality of variable gain signal translating stages, an amplified gain control deriving circuit comprising in combination; a transistor device including emitter, collector and base electrodes and a rectifying junction associated with said base electrode having a low resistance conductivity direction with respect to said base which is the same as that of said emitter electrode; means providing a source of bias voltage, a first and second resistors connected in the order named between said emitter electrode and said collector electrode in series with said source; filtering means connected in parallel with said second resistor to derive a substantially unidirectional voltage proportional to the average emitter current of said transistor, means for applying said voltage to said translating stages to control the gain thereof; input circuit means having a first terminal coupled to said rectifying junction and a second terminal coupled through a capacitor having low impedance to high frequency signals to said emitter electrode, said second terminal direct current conductively connected to said emitter electrode through a series combination of a third resistor and said first resistor; circuit means for deriving a signal representative of the modulation of the high frequency waves applied between said rectifying junction and emitter electrode comprising the rectifying junction, the input resistance between said base and emitter electrodes, and an impedance element exhibiting low impedance to said high frequency waves relative to said input resistance.

7. A signal receiver of the type including a plurality of variable gain signal translating stages, a combined detector-audio amplifier and automatic gain control circuit comprising in combination, a transistor device including emitter, collector and base electrodes and a rectifying junction associated with said base electrode, a source of operating current, a load resistor connected in series with said source between said emitter and collector electrodes, a bias resistor for establishing the quiescent bias level on said transistor and said rectifier connected between said base electrode and said source, means for applying signals representative of a high frequency signal received and translated through said signal translating stages coupled between said rectifying junction and said emitter electrode to produce a rectified current through the input resistance of said transistor device, a high frequency bypass capacitor connected between said emitter and base electrodes whereby signal currents flowing through said input resistance are representative of the modulation of said high frequency waves and are amplified through said transistor device and developed across said load resistor, signal output means connected with said load resistor, and automatic gain control deriving means connected with said transistor for deriving a direct voltage which is a function of the strength of said high frequency wave for application to said signal translating stages to control the gain thereof as an inverse function of said received wave strength.

8. A second detector-audio amplifier for radio signal receivers comprising a rectifier-transistor device, the transistor portion of which includes a base, emitter and collector electrodes; a rectifying contact on said base electrode having a low resistance conductivity direction with respect to said base which is the same as that of said emitter-electrode; means connecting the base, emitter and collector electrodes of the transistor portion of said device to amplify signals applied between said base and emitter electrodes; and means providing a detector circuit for deriving a signal representative of the amplitude modulation of a high frequency wave applied thereto including said rectifying contact and the input resistance between said base and emitter electrodes.

References Cited in the file of this patent

UNITED STATES PATENTS

| | | |
|---|---|---|
| 2,662,976 | Pankove | Dec. 15, 1953 |
| 2,676,271 | Baldwin | Apr. 20, 1954 |
| 2,891,146 | Sciurba | June 16, 1959 |
| 2,936,367 | Kobetich et al. | May 10, 1960 |
| 2,941,070 | Barry | June 14, 1960 |

FOREIGN PATENTS

| | | |
|---|---|---|
| 201,973 | Australia | May 30, 1956 |